United States Patent
Kono et al.

(10) Patent No.: US 11,312,578 B2
(45) Date of Patent: Apr. 26, 2022

(54) ARTICLE TRANSPORT FACILITY

(71) Applicant: Daifuku Co., Ltd., Osaka (JP)

(72) Inventors: Makoto Kono, Komaki (JP); Keisuke Takeno, Komaki (JP); Kazuhiro Iwamitsu, Komaki (JP)

(73) Assignee: Daifuku Co., Ltd., Osaka (JP)

( * ) Notice: Subject to any disclaimer, the term of this patent is extended or adjusted under 35 U.S.C. 154(b) by 0 days.

(21) Appl. No.: 17/087,824

(22) Filed: Nov. 3, 2020

(65) Prior Publication Data

US 2021/0139250 A1 May 13, 2021

(30) Foreign Application Priority Data

Nov. 6, 2019 (JP) .............................. JP2019-201546

(51) Int. Cl.
*B65G 43/08* (2006.01)
*B65G 1/04* (2006.01)
(Continued)

(52) U.S. Cl.
CPC .............. *B65G 43/08* (2013.01); *B61B 3/02* (2013.01); *B65G 1/0457* (2013.01); *B65G 35/06* (2013.01);
(Continued)

(58) Field of Classification Search
CPC .... B65G 43/08; B65G 1/0457; B65G 1/0492; B65G 35/06; B61B 3/02; H01L 21/67715; H01L 21/67727; H01L 21/6773; H01L 21/67733; H01L 21/67276; H01L 21/67706; H01L 21/67724; G05D 1/02
See application file for complete search history.

(56) References Cited

U.S. PATENT DOCUMENTS 6,285,951 B1 * 9/2001 Gaskins ............... G06Q 10/047
701/533
7,194,332 B2 * 3/2007 Fukunari ............. G03F 7/70525
700/112
(Continued)

FOREIGN PATENT DOCUMENTS

JP 200623176 A 1/2006
JP 4915302 B2 2/2012
(Continued)

*Primary Examiner* — William R Harp
(74) *Attorney, Agent, or Firm* — The Webb Law Firm

(57) ABSTRACT

An article transport facility includes article transport vehicles that travel along a specified travelable path, and a control device that controls the article transport vehicles. The travelable path includes nodes and links each connecting a pair of the nodes. The control device sets a setting path based on a link cost that is set for each of the links. The link cost includes a reference cost and a variable cost. The reference cost is a value that is set based on a reference passage time that is required for a target vehicle to pass through a target link in a state in which another vehicle is not present in the target link. The variable cost is a value that is set based on a vehicle count-related increased time by which an actual passage time is increased relative to the reference passage time according to the number of the other vehicles present in the target link, the actual passage time being a time required for the target vehicle to pass through the target link.

6 Claims, 9 Drawing Sheets

(51) Int. Cl.
*B61B 3/02* (2006.01)
*B65G 35/06* (2006.01)
*H01L 21/677* (2006.01)
*H01L 21/67* (2006.01)

(52) U.S. Cl.
CPC .... *H01L 21/6773* (2013.01); *H01L 21/67276* (2013.01); *H01L 21/67715* (2013.01); *H01L 21/67727* (2013.01); *H01L 21/67733* (2013.01)

(56) References Cited

U.S. PATENT DOCUMENTS

| | | | |
|---|---|---|---|
| 7,801,641 B2* | 9/2010 | Yoshikawa | B65G 37/02 700/228 |
| 2019/0122910 A1 | 4/2019 | Ogawa et al. | |

FOREIGN PATENT DOCUMENTS

| | | |
|---|---|---|
| JP | 2016133843 A | 7/2016 |
| JP | 2018169717 A | 11/2018 |
| JP | 201980411 A | 5/2019 |

* cited by examiner

ARTICLE TRANSPORT FACILITY

CROSS-REFERENCE TO RELATED APPLICATION

This application claims priority to Japanese Patent Application No. 2019-201546 filed Nov. 6, 2019, the disclosure of which is hereby incorporated by reference in its entirety.

BACKGROUND OF THE INVENTION

1. Field of the Invention

The present invention relates to an article transport facility including article transport vehicles that travel along a specified travelable path to transport an article, and a control device that controls the article transport vehicles.

2. Description of the Related Art

The article transport facility described in JP 2019-080411A (Patent Document 1) is, for example, known as such an article transport facility. In the following, the reference numerals or terms in parentheses in "Description of the Related Art" are those described in the related art document. The control device of the article transport facility described in Patent Document 1 performs a setting control to set a setting path serving as a path for causing an article transport vehicle to travel from the current position to a destination on a travelable path. For example, in the case of transporting an article from a transport source to a transport destination, when the article transport vehicle is present at a position corresponding to the transport source, the control device sets a setting path in the setting control, using the position corresponding to the transport source as the current position and a position corresponding to the transport destination as the destination.

SUMMARY OF THE INVENTION

In setting a setting path in the setting control as described above in the above-described article transport facility, there may be a plurality of candidate paths serving as candidates for the setting path from the current position of the article transport vehicle to the destination. In such a case, it is possible that the control device sets, as the setting path, for example, a candidate path with the shortest path length from among the plurality of candidate paths in the setting control. However, even if the setting path is set in this manner, it is possible that, due to the presence of many other article transport vehicles on the setting path, another candidate path that has not been set as the setting path may require a shorter time to reach the destination than the setting path. If the setting path is set according to a uniform setting standard in this manner, there may be cases where a path that requires a shorter time to reach the destination cannot be set as the setting path form among a plurality of candidate paths.

Therefore, there is a need for an article transport facility that is likely to increase the possibility that a path that requires a shorter time to reach the destination can be set as a setting path from among a plurality of candidate paths.

A characteristic feature of an article transport facility according to the present disclosure includes: article transport vehicles that travel along a specified travelable path to transport an article; and a control device that controls the article transport vehicles, wherein the travelable path includes a plurality of nodes at each of which a path is branched or merged, and a plurality of links each of which serves as a path portion connecting a pair of the nodes, the control device performs a path setting control to set, based on a link cost that is set for each of the links, a setting path serving as a path for causing the article transport vehicles to travel from a current position to a destination on the travelable path, the link cost includes a reference cost and a variable cost, one of the article transport vehicles that passes through the links in order to set the link cost is used as a target vehicle, the link through which the target vehicle passes is used as a target link, at least one of the article transport vehicles other than the target vehicle is used as another vehicle, and one of the article transport vehicles for which the setting path is set by the path setting control is used as a setting vehicle, the reference cost is a value that is set based on a reference passage time that is required for the target vehicle to pass through the target link in a state in which the other vehicle is not present in the target link, the variable cost is a value that is set based on a vehicle count-related increased time by which an actual passage time is increased relative to the reference passage time according to the number of the other vehicles present in the target link, the actual passage time being a time required for the target vehicle to pass through the target link in an actual traveling state in which the target vehicle travels on the target link in a state in which the other vehicle is present in the target link, and, in the path setting control, the control device determines a vehicle count value that is the number of the other vehicles that are assumed to be present in the target link, determines, based on the variable cost according to the vehicle count value and the reference cost, the link cost of each of the links on candidate paths serving as candidates for the setting path from the current position of the setting vehicle to the destination, obtains, based on the link costs, path costs that are costs of the candidate paths, and sets the setting path based on the path cost of each of the candidate paths.

With this configuration, when the control device sets the setting path by the path setting control, the control device determines the link cost of each of the links on candidate paths serving as candidates for the setting path from the current position of the setting vehicle to the destination. The link cost includes a reference cost and a variable cost. Here, the variable cost is a value that is set based on a vehicle count-related increased time that increases according to the number of the other vehicles. In the path setting control, a variable cost according to the vehicle count value of the other vehicles that are assumed to be present in each of the links on the candidate paths is used. Then, a path cost that is the cost of each of the candidate paths is obtained based on the link costs determined in this manner, and the setting path is set based on the path cost of each of the candidate paths. Accordingly, with this configuration, it is possible to appropriately set the setting path, taking into consideration the path traveling time under no influence of the other vehicles and the path traveling time according to the number of other vehicles under the influence of the other vehicles. Therefore, it is possible to increase the possibility that a path that requires a shorter time to reach the destination can be set as the setting path.

DETAILED DESCRIPTION OF PREFERRED EMBODIMENTS

1. Embodiment

An embodiment of an article transport facility will be described with reference to the drawings.

Figure 1:
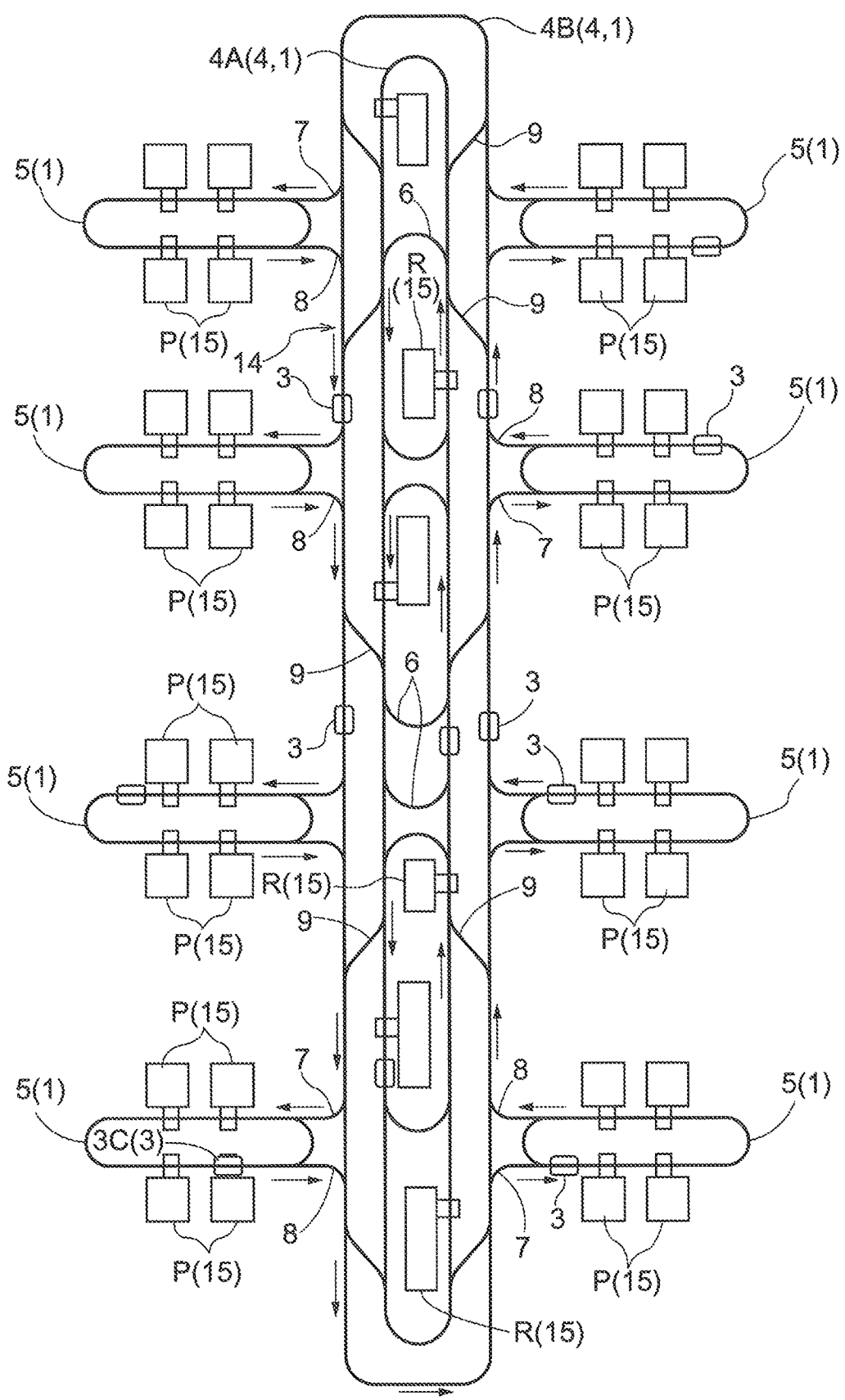
FIG. 1 is a plan view of an article transport facility.

As shown in FIG. 1, the article transport facility includes article transport vehicles 3 that travel along a specified travelable path 1 to transport an article W, and a control device H (see FIG. 5) that controls the article transport vehicles 3. In the present embodiment, a travel rail 2 (see FIGS. 2 and 3) is installed along the specified travelable path 1, and a plurality of article transport vehicles 3 are provided. Each of the plurality of article transport vehicles 3 travels in one direction along the travelable path 1 on the travel rail 2. As shown in FIG. 4, the travel rail 2 is formed by a pair of left and right rail portions. Note that, in the present embodiment, each article transport vehicle 3 transports, as the article W, a FOUP (Front Opening Unified Pod) that accommodates semiconductor substrates.

As shown in FIG. 1, the travelable path 1 includes two main paths 4, and a plurality of sub paths 5 passing through a plurality of article processing devices P. Each of the two main paths 4 and the plurality of sub paths 5 is formed in an annular shape. The two main paths 4 are provided so as to form double annular shapes. These two annular main paths 4 are paths along which each article transport vehicle 3 travels so as to rotate in the same rotation direction (counterclockwise direction). Note that, in FIG. 1, the traveling directions of the article transport vehicle 3 are indicated by the arrows.

Of the two main paths 4, the inner main path 4 is referred to as a first main path 4A, and the outer main path 4 is referred to as a second main path 4B. The first main path 4A is set so as to pass through a plurality of storage portions R. The first main path 4A is used as an article transfer path for stopping each article transport vehicle 3 between the storage portions R in order to transfer the article W. On the other hand, the second main path 4B is used as a continuous travel path for causing the article transport vehicle 3 to continuously travel.

The travelable path 1 includes short paths 6, branching paths 7, merging paths 8, and transit paths 9. Each short path 6 is connected to each of a pair of portions of the first main path 4A that extend parallel to each other and linearly. Each short path 6 is a path for causing the article transport vehicle 3 to travel from one of the linearly extending pair of portions of the first main path 4A to the other, or vice versa. Each branching path 7 is connected to the second main path 4B and the sub path 5, and is a path for causing the article transport vehicle 3 to travel from the second main path 4B to the sub path 5. Each merging path 8 is connected to the sub path 5 and the second main path 4B, and is a path for causing the article transport vehicle 3 to travel from the sub path 5 to the second main path 4B. Each transit path 9 is connected to the first main path 4A and the second main path 4B, and is a path for causing the article transport vehicle 3 to travel from the first main path 4A to the second main path 4B, or from the second main path 4B to the first main path 4A.

Figure 2:
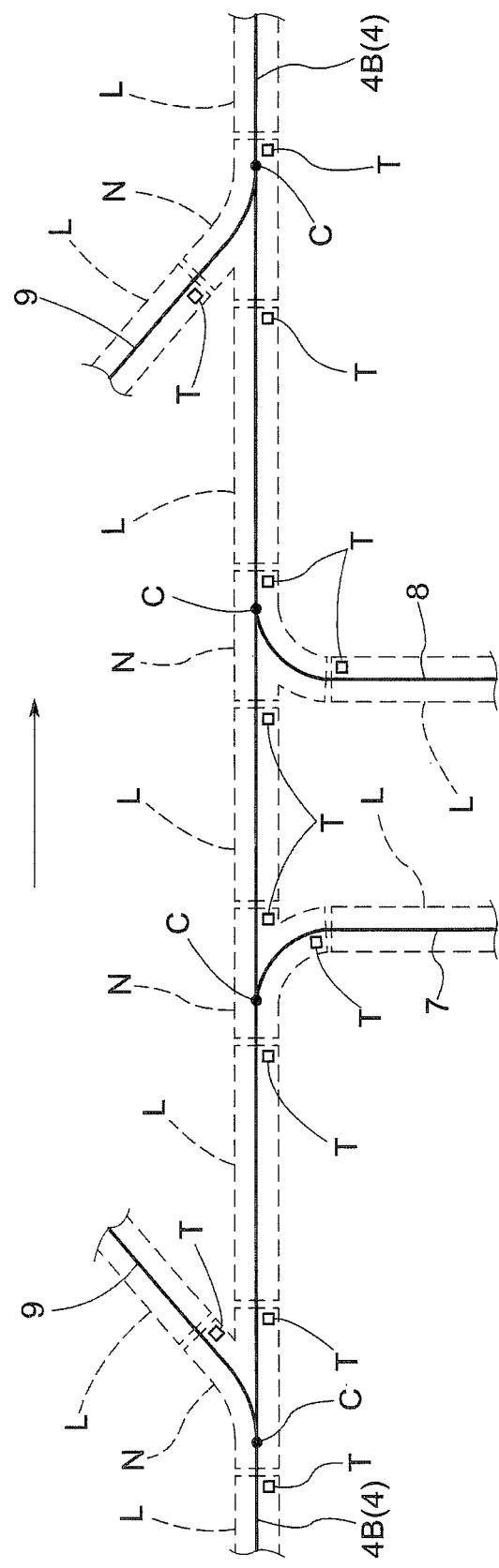
FIG. 2 is a diagram showing nodes and links of a travelable path.

As shown in FIG. 2, the travelable path 1 includes a plurality of nodes N at each of which a path is branched or merged, and a plurality of links L each of which serves as a path portion for connecting a pair of nodes N. In the present embodiment, each node N is a path portion extending over a specified range upstream and downstream from a connection point C at which two paths are branched or merged. To describe a part of the second main path 4B shown in FIG. 2 as an example, a point at which a transit path 9 is branched from or merged with the second main path 4B is a connection point C, and a specified range from the connection point C on the second main path 4B and the transit path 9 is a node N. A point at which a branching path 7 is branched from the second main path 4B is a connection point C, and a specified range from the connection point C on the second main path 4B and the branching path 7 is a node N. A point at which a merging path 8 is merged with the second main path 4B is a connection point C, and a specified range from the connection point C on the second main path 4B and the merging path 8 is a node N. Also, a path portion that is located between a pair of nodes N on the second main path 4B and is connected to the pair of nodes N is a link L. In the present embodiment, as will be described later, the specified range from the connection point C is set with reference to the positions of a plurality of detection target objects T that are installed along the travelable path 1. In other words, each detection target object T is installed at a position serving as a boundary between a node N and a link L.

Figure 3:
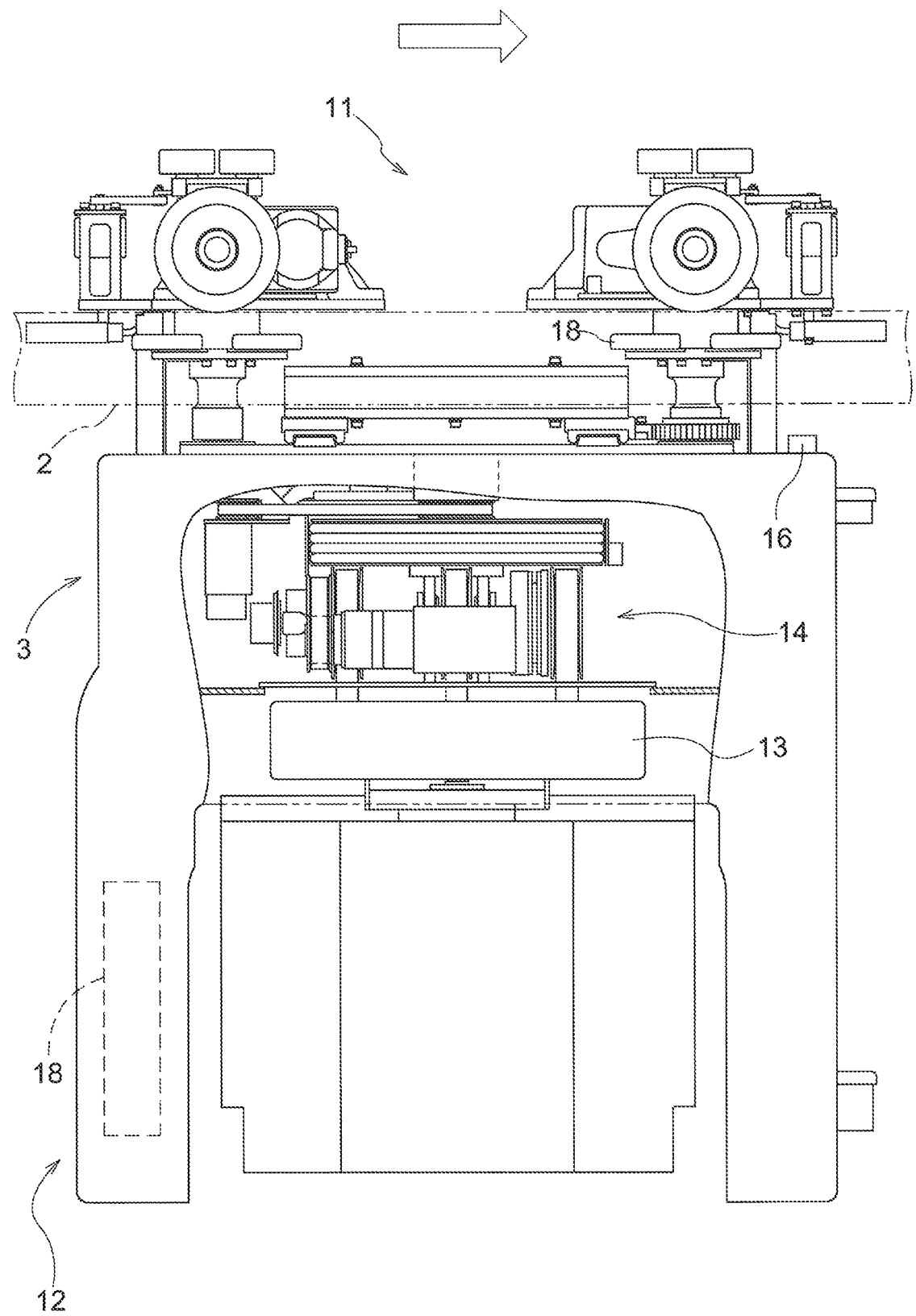
FIG. 3 is a side view of an article transport vehicle.
Figure 4:
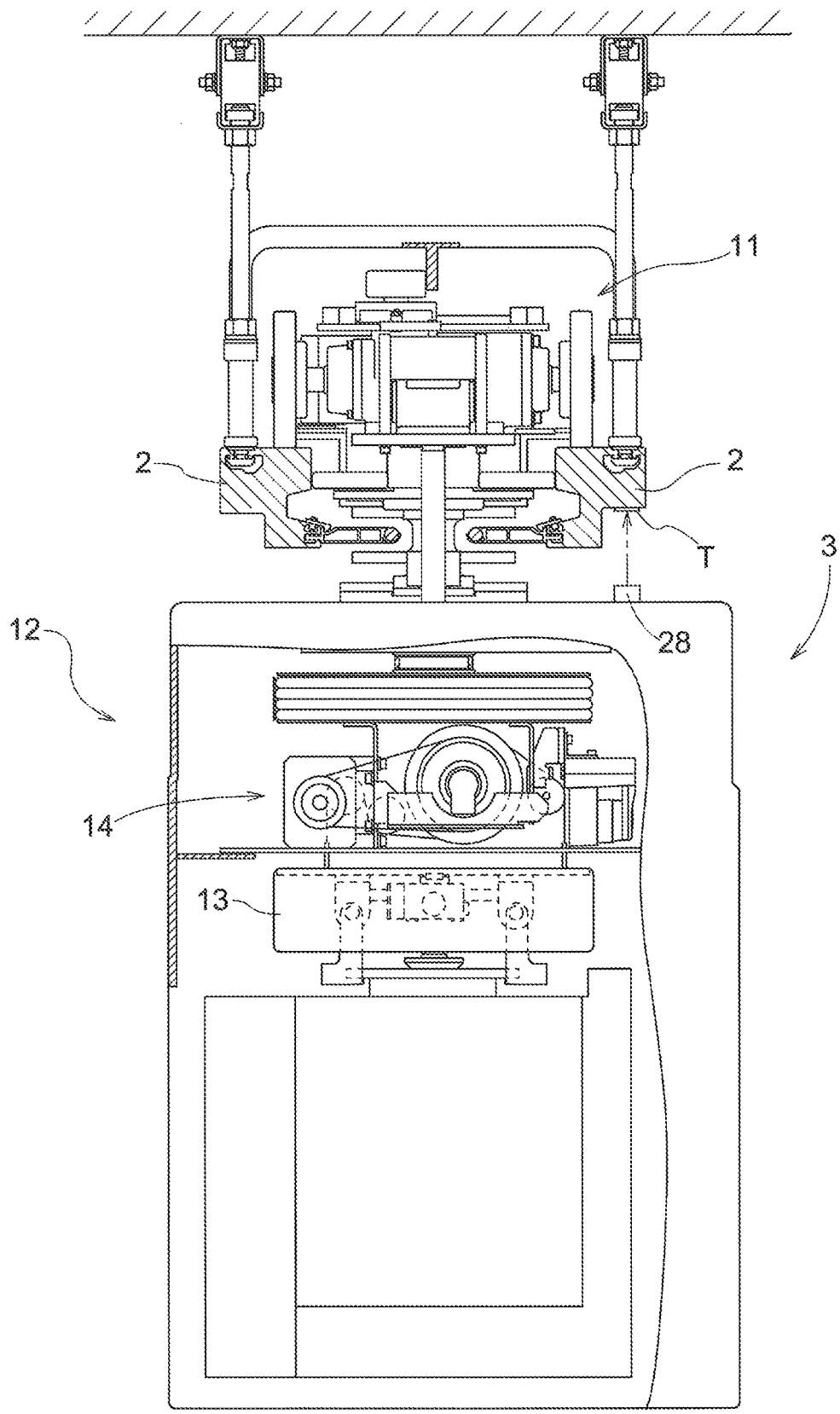
FIG. 4 is a front view of the article transport vehicle.

As shown in FIGS. 3 and 4, the article transport vehicle 3 includes a travel portion 11 that travels on a travel rail 2 suspended and supported from the ceiling along the travel rail 2, and a main body portion 12 that is located below the travel rail 2 and suspended and supported by the travel portion 11. The main body portion 12 includes a support mechanism 13 for supporting the article W in a suspended state, and an elevation mechanism 14 for moving the support mechanism 13 in the up-down direction relative to the main body portion 12. Also, the article transport vehicle 3 travels to the position corresponding to a transfer target location 15 of a transport source, with the article processing device P or the storage portion R as the transfer target location 15 (see FIG. 1), subsequently supports the article W located at the transfer target location 15 of the transport source, and transfers the article W from the transfer target location 15 to the main body portion 12. Thereafter, the article transport vehicle 3 travels to the position corresponding to a transfer target location 15 of a transport destination, and transfers the article W supported by the support mechanism 13 from the inside of the main body portion 12 to the transfer target location 15. Thus, the article W is transported from the transfer target location 15 of the transport source to the transfer target location 15 of the transport destination. At this time, in the present embodiment, the article transport vehicle 3 travels at a first speed when traveling along a straight path, and travels at a second speed lower than the first speed when traveling along a curved path.

Figure 5:
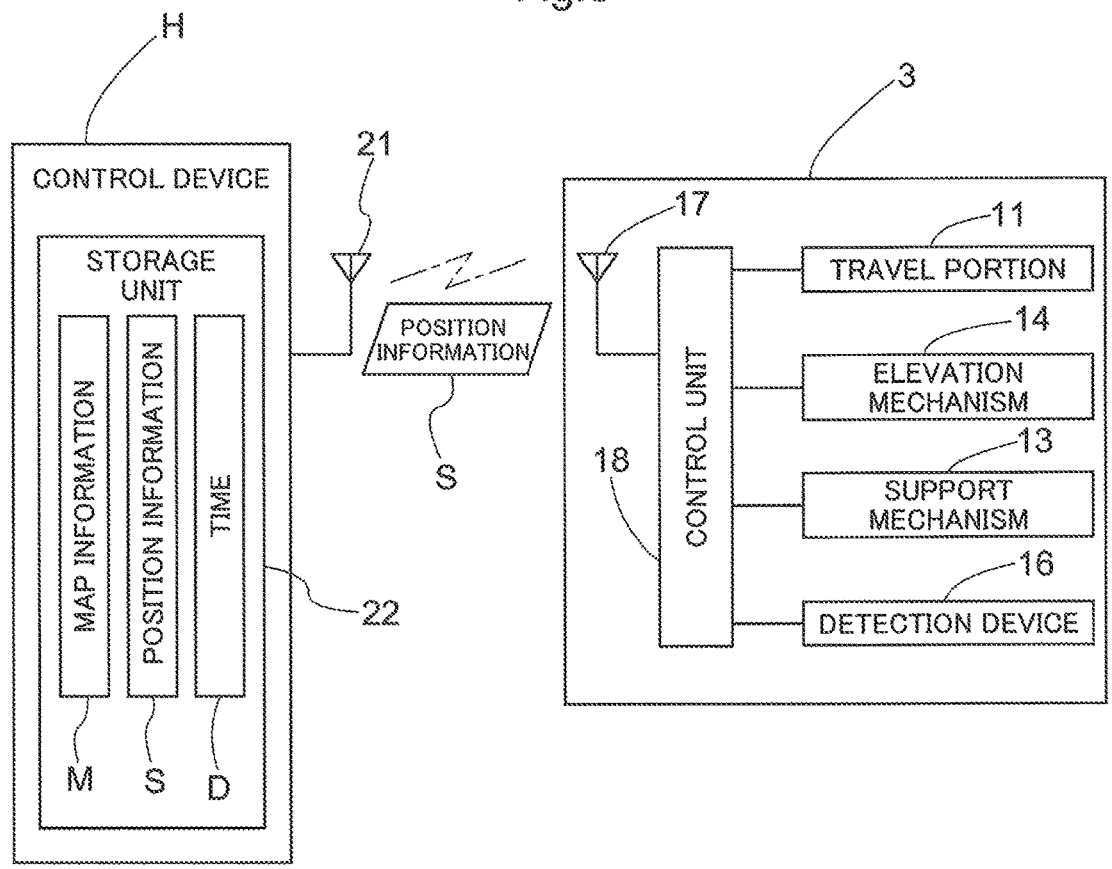
FIG. 5 is a control block diagram.

As shown in FIG. 5, the article transport vehicle 3 includes a detection device 16, a transmitting/receiving device 17, and a control unit 18. The detection device 16 detects a plurality of detection target objects T (see FIGS. 2 and 4) that are installed along the travelable path 1. In each detection target object T, position information is held that indicates the position at which the detection target object T is installed, and the detection device 16 is configured to read the position information held in the detection target object T. A plurality of the detection target objects T are installed along the travelable path 1, and are installed at a location of connection between a node N and a link L, the position corresponding to a transfer target location 15, and so forth. The position information of the detection target object T is read by the detection device 16, and the transmitting/receiving device 17 transmits the read position information S to the transmitting/receiving unit 21 of the control device H as needed. That is, the article transport vehicle 3 transmits the position information S to the control device H when moving into a link L, moving out of a link L, and reaching the position corresponding to a transfer target location 15. The position information S that the article transport vehicle 3 transmits to the control device H corresponds to position information S indicating the position of that article transport vehicle 3. Also, each of the plurality of article transport vehicles 3 transmits the position information S indicating its own position to the control device H. In addition, the transmitting/receiving device 17 receives the information transmitted from the transmitting/receiving unit 21 of the control device H.

The control device H stores the position information S received from each of the plurality of article transport vehicles 3 in association with time D in the storage unit 22. In the present embodiment, the control device H stores the time D at which position information S is received from the transmitting/receiving device 17 of the article transport vehicle 3 in association with that position information S. Note that, when the article transport vehicle 3 is configured to transmit, to the control device H, time information indicating the time D at which the position information S of a detection target object T is read, together with the position information S, the control device H may store the time D indicted by that time information and the position information S in association with each other in the storage unit 22. Also, the control device H acquires vehicle count information based on the position of each of the article transport vehicles 3 at each of the times, the position being obtained from the information stored in the storage unit 22. Based on the position information S received from each of the plurality of article transport vehicles 3, the control device H can acquire the position of the travelable path 1 of each of the plurality of article transport vehicles 3. For example, after the reception of the position information S transmitted when the article transport vehicle 3 moves into a link L until the reception of the position information S transmitted when the article transport vehicle 3 moves out of the link L, the control device H can determine that the article transport vehicle 3 is present in the link L having an entrance indicated by the received position information S. When the transfer target location 15 is present in a link L, if the position information S that is transmitted from the article transport vehicle 3 determined to be present in that link L when the article transport vehicle 3 has reached the transfer target location 15 is not received, it can be determined that the article transport vehicle 3 is present upstream relative to the transfer target location 15 in the link L. If the aforementioned position information S is received, it can be determined that the article transport vehicle 3 is present at the transfer target location 15 or upstream relative thereto in the link L. In this manner, the control device H acquires the number of the article transport vehicles 3 located in each of a plurality of links L, based on the position of each of the plurality of article transport vehicles 3 at each of the times. In this case, for a link L in which the transfer target location 15 is present, the control device H acquires the number of the article transport vehicles 3 located upstream of the transfer target location 15 in the link L, and the number of the article transport vehicles 3 located downstream of the transfer target location 15 in the link L.

Figure 6:
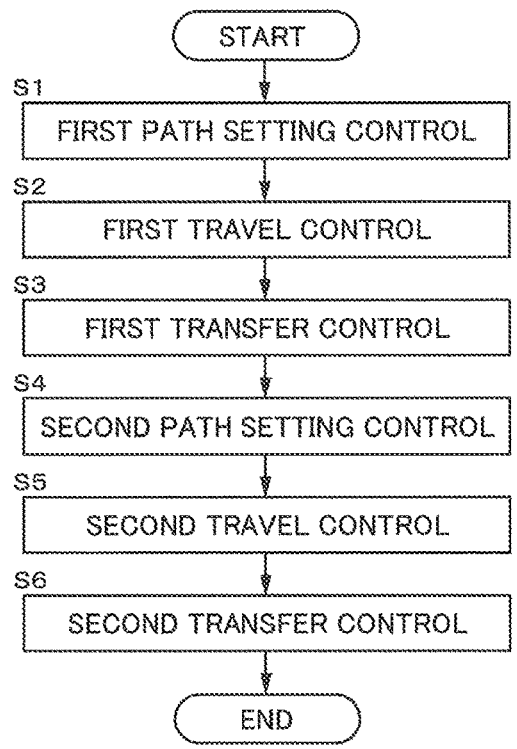
FIG. 6 is a flowchart of a transport control.

The control device H stores map information in the storage unit 22. The map information includes basic map information including information indicating the positions and the connection relationships of a plurality of links L and a plurality of nodes N on the travelable path 1, attribute information indicating the attribute of each of the plurality of links L and the plurality of nodes N, and information indicating the shape of each of the plurality of links L and the shape of each of the plurality of nodes N. The map information also includes travel control information in which various types of information necessary for traveling of the article transport vehicle 3, such as the respective pieces of position information S of a plurality of points on the travelable path 1, are associated with the basic map information. In the case of transporting an article W from a transport source to a transport destination, as shown in the flowchart of the transport control in FIG. 6, the control device H performs, in the order described: a first path setting control (S1) to set a first setting path for causing the article transport vehicle 3 to travel from the current position to a position (destination) corresponding to the transfer target location 15 of the transport source based on the basic map information; a first travel control (S2) to cause the article transport vehicle 3 to travel along the first setting path so as to travel to a position corresponding to the transfer target location 15 of the transport source; a first transfer control (S3) to transfer the article W located at the transfer target location 15 of the transport source to the inside of the main body portion 12; a second path setting control (S4) to set a second setting path for causing the article transport vehicle 3 to travel from the current position to a position (destination) corresponding to the transfer target location 15 of the transport destination based on the basic map information; a second travel control (S5) to cause the article transport vehicle 3 to travel along the second setting path so as to travel to a position corresponding to the transfer target location 15 of the transport destination; and a second transfer control (S6) to transfer the article W inside the main body portion 12 to the transfer target location 15 of the transport destination.

Figure 14:
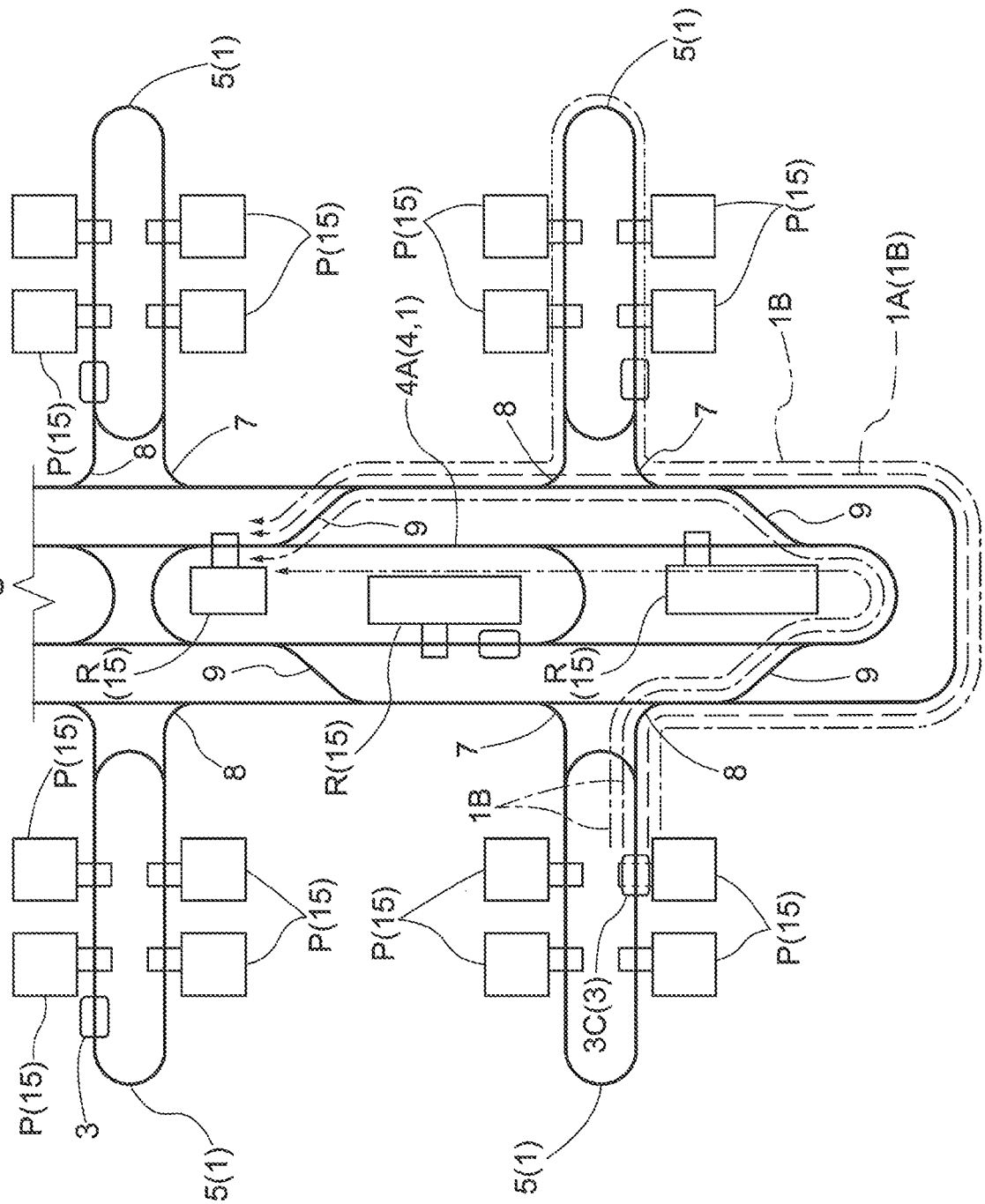
FIG. 14 is a diagram showing examples of a setting path and candidate paths of article transport vehicles.

The control device H performs a path setting control to set, based on a link cost that is set for each of the links L, a setting path 1A (e.g., the path indicated by the broken line in FIG. 14) serving as a path for causing the article transport vehicle 3 to travel from the current position to the destination on the travelable path 1. The link cost includes a reference cost and a variable cost. Note that the setting path 1A includes the first setting path and the second setting path described above. Also, the path setting control includes the first path setting control and the second path setting control described above.

Next, the link cost will be described. This description will be given assuming that an article transport vehicle 3 that passes through a link L in order to set the link cost is a target vehicle 3A, a link L through which the target vehicle 3A passes is a target link LA, an article transport vehicle 3 other than the target vehicle 3A is another vehicle 3B, and an article transport vehicle 3 for which the setting path 1A is set by the path setting control is a setting vehicle 3C. In the present embodiment, a plurality of article transport vehicles 3 simultaneously travel along the travelable path 1. Therefore, it is assumed that, of a plurality of article transport vehicles 3 that pass through a link L in order to set the link cost, an article transport vehicle 3 being described is a target vehicle 3A, and all the article transport vehicles 3 other than the target vehicle 3A are the other vehicles 3B. Also, it is assumed that, of a plurality of links L through which the target vehicle 3A passes, a link L being described is a target link LA. On the other hand, it is assumed that, of a plurality of article transport vehicles 3 present on the travelable path 1, an article transport vehicle 3 for which the path setting control is to be performed is a setting vehicle 3C.

Figure 7:
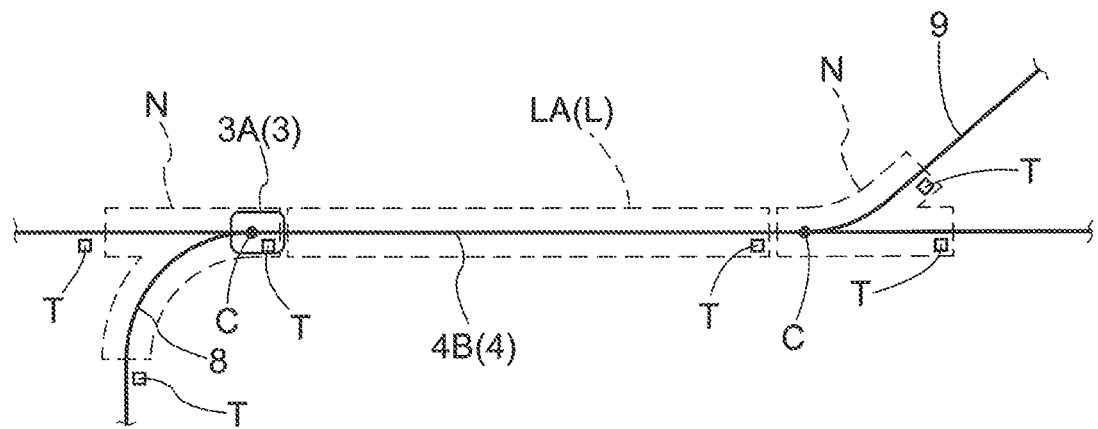
FIG. 7 is a diagram showing a state in which a target vehicle moves into a target link in an empty traveling state.
Figure 8:
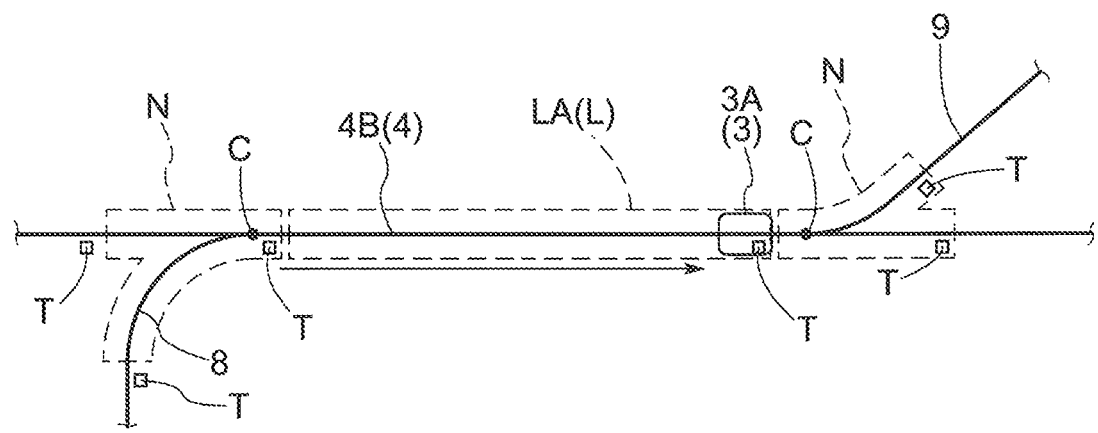
FIG. 8 is a diagram showing a state in which the target vehicle moves out of the target link in the empty traveling state.

The reference cost is a value that is set based on a reference passage time that is required for the target vehicle 3A to pass through the target link LA in a state in which the other vehicle 3B is not present in the target link LA. In the present embodiment, when the position information S transmitted from the target vehicle 3A moving into the target link LA is received in an empty traveling state in which the other vehicle 3B is not present in the target link LA as shown in FIG. 7, the control device H calculates the reference passage time from the difference between the time D at which the position information S transmitted from the target vehicle 3A moving into the target link LA is received and the time D at which the position information S transmitted from the target vehicle 3A moving out of the target link LA is received as shown in FIG. 8. Then, the control device H sets a reference cost based on the reference passage time. In the present embodiment, the reference cost is the number of seconds of the reference passage time.

Here, in order to increase the accuracy of the reference cost as an indicator, the control device H causes the target vehicle 3A to travel a plurality of times on the target link LA in a state in which the other vehicle 3B is not present in the target link LA, acquires the reference passage time at each of the times of traveling, and sets the reference cost based on the plurality of acquired reference passage times. In the present embodiment, the control device H sets the reference cost by dividing the total of the reference passage times at all of the times of traveling by the number of times of traveling. For example, if the reference passage times are 5 seconds and 8 seconds in the case of setting the reference cost by two times of traveling, 6.5, which is the number of seconds obtained by dividing 13 seconds, which is the sum of 5 seconds and 8 seconds, by 2, which is the number of times of traveling, is set as the reference cost. In the present embodiment, the setting of the reference cost is performed in advance for each of all the links L belonging to the travelable path 1 by causing the target vehicle 3A to travel a plurality of times throughout the travelable path 1 before the start of an operation for transporting the article W in the article transport facility. That is, before the control device H performs the path setting control for the first time (here, before the start of the operation), the reference cost is set for each of all the links L belonging to the travelable path 1.

In addition, a node cost is set for all the nodes N belonging to the travelable path 1 before the path setting control is performed (before the start of the operation in the present embodiment). This node cost is a cost that is set for each of the nodes N. In the present embodiment, the control device H performs control to allow only one article transport vehicle 3 to move into the segment of a node N, and therefore the passage time in which the article transport vehicle 3 passes through the segment of a node N is substantially constant. Therefore, in this example, the node cost is a fixed value including no variable component. Here, the node cost is set to be a value according to each of the shapes of the nodes N. Note that the present disclosure is not limited thereto, and it is also preferable that the node cost is a value that is set based on the reference passage time required for the target vehicle 3A to pass through the target node N in a state in which the other vehicle 3B is not present, as in the case of the above-described reference cost. Alternatively, the node cost may be the same value for all of the nodes N, regardless of the shape and the like.

The variable cost is a value that is set based on a vehicle count-related increased time by which an actual passage time is increased relative to the reference passage time according to the number of other vehicles 3B present in the target link LA, the actual passage time being a time required for the target vehicle 3A to pass through the target link LA in an actual traveling state in which the target vehicle 3A travels on the target link LA in a state in which the other vehicle 3B is present in the target link LA.

Here, in order to increase the accuracy of the variable cost as an indicator, the control device H causes the target vehicle 3A to travel a plurality of times on the target link LA in a state in which the other vehicle 3B is present in the target link LA, acquires, at each of the times of traveling, the vehicle count information indicating the number of the other vehicles 3B present in the target link LA and the actual passage time, and obtains the vehicle count-related increased time based on a correlation between the increased amount of the actual passage time relative to the reference passage time and the vehicle count information. Specifically, the control device H uses, as the vehicle count-related increased time, an increased amount of the actual passage time for one other vehicle, the increased amount being obtained by dividing the increased amount of the actual passage time relative to the reference passage time by the vehicle count indicated in the vehicle count information. Also, the control device H uses, as the final vehicle count-related increased time, an average value of the vehicle count-related increased times obtained by causing the target vehicle 3A to travel a plurality of times on the target link LA.

Figure 9:
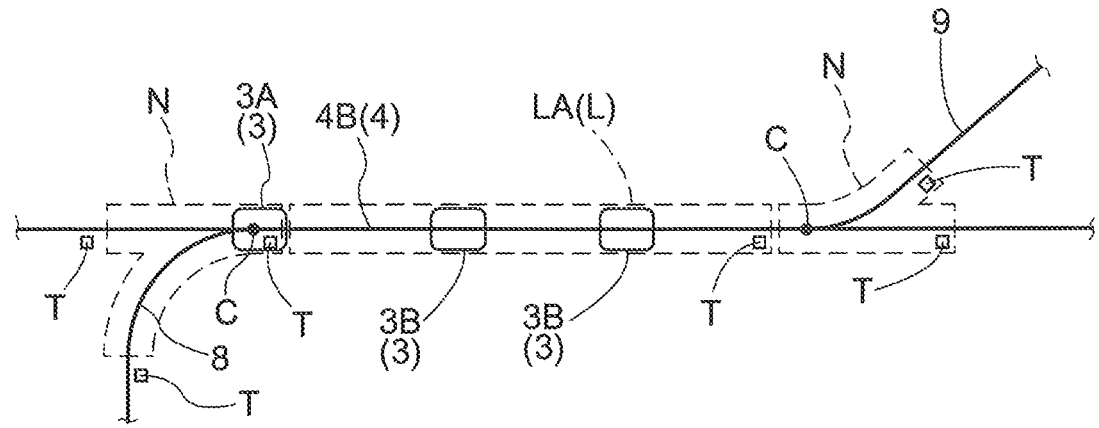
FIG. 9 is a diagram showing a state in which a target vehicle moves into a target link in an actual traveling state.
Figure 10:
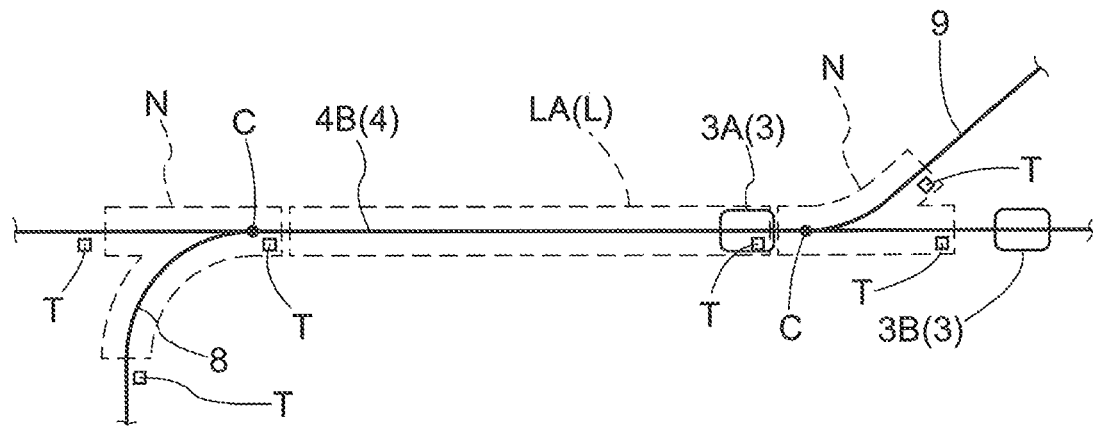
FIG. 10 is a diagram showing a state in which the target vehicle moves out of the target link in the actual traveling state.

In the present embodiment, when the position information S transmitted from the target vehicle 3A moving into the target link LA is received in the actual traveling state in which the other vehicle 3B is present in the target link LA as shown in FIG. 9, the control device H calculates the actual passage time from the difference between the time D at which the position information S transmitted from the target vehicle 3A moving into the target link LA is received and the time D at which the position information S transmitted from the target vehicle 3A moving out of the target link LA is received as shown in FIG. 10. Then, the control device H divides the increased amount (e.g., 10 seconds) of the actual passage time (e.g., 15 seconds) relative to the reference passage time (e.g., 5 seconds) by the vehicle count (2 in FIG. 9) indicated in the vehicle count information, thus obtaining a vehicle count-related increased time (e.g., 5 seconds).

In the present embodiment, such calculations of the vehicle count-related increased time is performed both before the start of an operation for transporting the article W in the article transport facility and after the start of the operation. That is, the control device H first causes the target vehicle 3A and a plurality of article transport vehicles 3 serving as the other vehicles 3B to travel throughout the travelable path 1 before the start of the operation, thus obtaining a vehicle count-related increased time on each of all the links L belonging to the travelable path 1. That is, before performing the path setting control for the first time (here, before the start of the operation), the control device H sets the initial vehicle count-related increased time for each of all the links L belonging to the travelable path 1. After the start of the operation, which is after starting the transport of the article W in the article transport facility, the control device H also obtains the vehicle count-related increased time on each of the links L belonging to the travelable path 1, using each of the plurality of article transport vehicles 3 traveling on the travelable path 1 as the target vehicle 3A and the other vehicle 3B, and, based on the obtained vehicle count-related increased time, updates the vehicle count-related increased time as needed. At this time, the control device H obtains the vehicle count-related increased time each time the target vehicle 3A passes through each of the target links LA, and updates the vehicle count-related increased time based on the obtained vehicle count-related increased time and the vehicle count-related increased time obtained in the past. It is preferable that such update of the vehicle count-related increased time is continuously performed during operation of the article transport facility. Also, it is preferable that the variable cost used for the path setting control is set using the most update vehicle count-related increased time.

In the path setting control, the control device H determines a vehicle count value, which is the number of other vehicles 3B that are assumed to be present in the target link LA, and sets the variable cost of the target link LA according to the vehicle count value. In the present embodiment, the control device H sets, as the variable cost, a value obtained by multiplying the vehicle count-related increased time (the increased amount of the actual passage time for one other vehicle), obtained in the above-described manner, of the target link LA by the vehicle count value of the target link LA. That is, the variable cost is set as the number of seconds obtained by multiplying the vehicle count-related increased time by the vehicle count value. For example, if the vehicle count value of the target link LA is 4, and the vehicle count-related increased time is 5 seconds, then 20 is set as the variable cost. In this manner, the variable cost serves as an indicator representing the increased amount of the actual passage time, which is expected to increase with an increase in the number of the other vehicles 3B that are assumed to be present in the target link LA, of the target link LA. Also, in the case of performing the path setting control, the control device H sets the variable cost for each of all the links L belonging to candidate paths 1B (e.g., the paths indicated by the broken line or the dashed dotted line in FIG. 14) serving as candidates for the setting path 1A (e.g., the path indicated by the broken line in FIG. 14) from the current position of the setting vehicle 3C to the destination.

The control device H determines, based on the variable cost and the reference cost set in this manner, the link cost of each of the links L on the candidate paths 1B serving as candidates for the setting path 1A from the current position of the setting vehicle 3C to the destination. Then, based on the link costs, the control device H obtains path costs that are the overall costs of the candidate paths 1B, and sets the setting path 1A based on the path cost of each of the candidate paths 1B.

Figure 11:
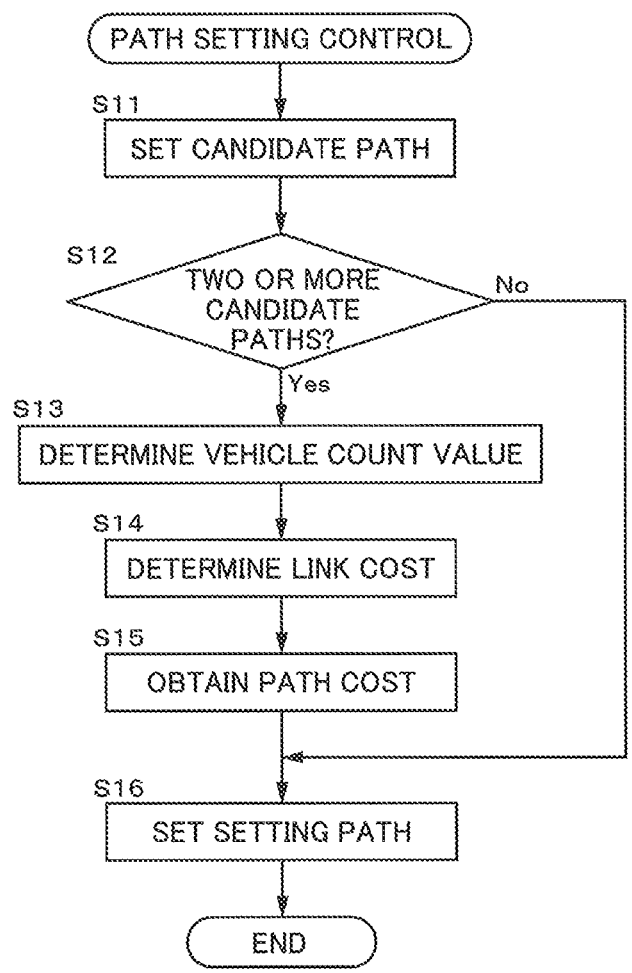
FIG. 11 is a flowchart of a path setting control.

In the present embodiment, as shown in the flowchart of the path setting control in FIG. 11, the control device H sets one or more candidate paths 1B based on information on the current position of the setting vehicle 3C, information on the destination, and map information, assuming that paths travelable from the current position to the destination are the candidate paths 1B (S11). Then, if two or more candidate paths 1B are set (S12: Yes), the control device H determines the vehicle count value for each of all the links L belonging to the candidate paths 1B (S13). The method for determining the vehicle count value will be described later. Next, the control device H determines a link cost based on the variable cost according to the vehicle count value and the reference cost for each of all the links L belonging to the candidate paths 1B (S14). Then, the control device H obtains path costs that are the overall cost of the candidate paths 1B, based on the link cost of each of the links L belonging to the candidate paths 1B (S15), and sets one setting path 1A out of the two or more candidate paths 1B, based on the path cost of each of the candidate paths 1B (S16). Note that, if only one candidate path 1B is set (S12: No), the control device H sets the candidate path 1B as the setting path 1A (S16).

Figure 12:
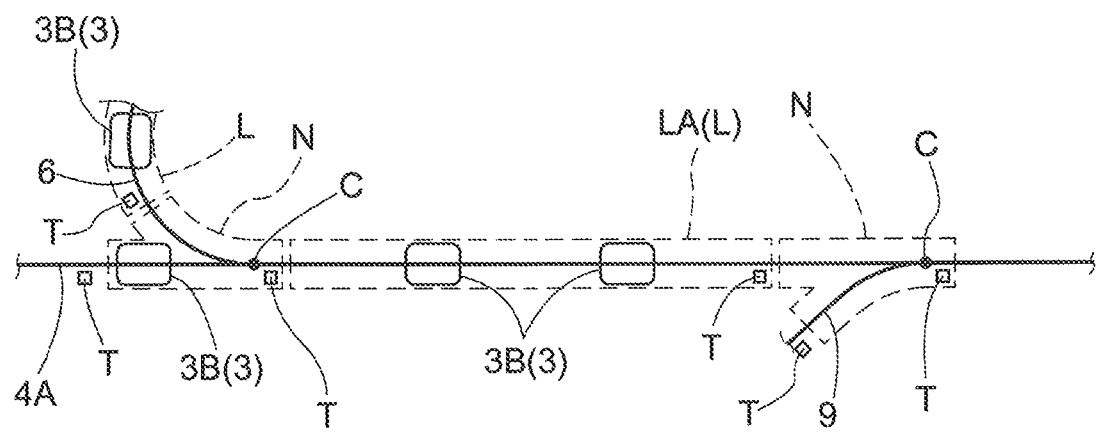
FIG. 12 is a diagram showing other vehicles that are assumed to be present in a target link.

Here, the method for determining the vehicle count value will be described. The control device H determines the vehicle count value, assuming that the other vehicles 3B that have been determined to be actually present in the target link LA are present in the target link LA. Additionally, in the present embodiment, the control device H determines the vehicle count value, assuming that the other vehicle 3B for which the setting path 1A passing through the target link LA has already been set is present in the target link LA, regardless of the current position of the other vehicle 3B. Note that the other vehicle 3B for which the setting path 1A passing through the target link LA has already been set includes the other vehicle 3B for which the setting path 1A whose destination is located inside the target link LA. That is, in the present embodiment, the control device H determines the vehicle count value (4 in the example shown in FIG. 12), assuming that, in addition to other vehicles 3B (two vehicles in the example shown in FIG. 12) that have been determined to be present in the target link LA at the time of performing the path setting control for the setting vehicle 3C, other vehicles 3B (two vehicles in the example shown in FIG. 12) for which the whole or a part of the target link LA has already been set as the setting path 1A are present in the target link LA, even if they have been determined to be not present in the target link LA at the time of performing the path setting control. In this manner, the control device H determines the vehicle count value for each of the plurality of target links LA, using the links L respectively belonging to the plurality of candidate paths 1B as the target links LA.

By determining the vehicle count value in this manner, it is possible to determine the link cost of the target link LA, taking into consideration not only the actual degree of congestion (two other vehicles 3B in the example shown in FIG. 12) of the target link LA at the time of performing the path setting control for the setting vehicle 3C, but also the future degree of congestion of the target link LA. Specifically, other vehicles 3B that are not present in the target link LA at the time of performing the path setting control can be present in the target link LA before or after the passage of the setting vehicle 3C through the target link LA if they are scheduled to pass through the target link LA. Therefore, there is a possibility that the other vehicles 3B may increase the degree of congestion of the target link LA. Also, if there are many other vehicles 3B that are scheduled to pass through the target link LA, there is a high possibility that other vehicles 3B that are not present in the target link LA before or after the passage of the setting vehicle 3C through the target link LA may increase the future degree of congestion of the target link LA. With the configuration of the present embodiment, it is possible to determine the link cost of the target link LA, also taking into consideration such the further degree of congestion of the target link LA, and therefore the setting path 1A of the setting vehicle 3C can be easily set appropriately.

Also, the control device H determines the link cost for each of the plurality of target links LA constituting each candidate path 1B. The link cost is determined based on the reference cost and the variable cost according to the vehicle count value. In the present embodiment, a value obtained by adding the variable cost to the reference cost is determined as the link cost. As described above, the reference cost is a value that is set based on the reference passage time, and is the number of seconds of the reference passage time in the present embodiment. Accordingly, for example, if the reference passage time is 10 seconds, then the reference cost is set as "10". The variable cost is a value that is set based on the vehicle count-related increased time, and is the number of seconds that is set based on a value obtained by multiplying the vehicle count value by the vehicle count-related increased time indicating the increased time for one other vehicle in the present embodiment. Accordingly, for example, if the vehicle count value is 4, and the vehicle count-related increased time is 5 seconds, then the variable cost is set as "20". When the reference cost and the variable cost are set as in the case of these examples, "30", which is obtained by adding the variable cost "20" to the reference cost "10", is determined as the link cost for the target link LA. The control device H performs such determination of the link cost for each of the plurality of target links LA constituting the candidate path 1B.

In the present embodiment, the control device H corrects the link cost using a density value. Here, the density value is a value obtained by dividing the vehicle count value by a maximum value of the number of article transport vehicles 3 that can be present in the target link LA. That is, the density value is a value representing the degree of congestion of a target link LA, taking the path length of that target link LA into consideration. For example, if the maximum value of the number of article transport vehicles 3 that can be present in the target link LA is 5, and the vehicle count value determined in the above-described manner is 6, then the density value is 1.2. For example, if the maximum value of the number of article transport vehicles 3 that can be present in the target link LA is 10, and the vehicle count value determined in the above-described manner is 7, then the density value is 0.7. Also, in the present embodiment, the control device H multiplies a value obtained by adding the variable cost (e.g., 20) to the reference cost (e.g., 10) by the density value (e.g., 1.2), and uses the resulting corrected value (e.g., 36) as the link cost. In this manner, in the present embodiment, the control device H uses the density value to correct the link cost such that the link cost increases with an increase in the density value in the path setting control. The control device H performs such correction of the density value using the link cost for each of the plurality of target links LA constituting the candidate path 1B.

By performing such correction of the link cost, the degree of congestion of the target link LA according to the maximum value (the path length of the target link LA) of article transport vehicles 3 that can be present in the target link LA can be reflected in the link cost. Also, by correcting the link cost such that the link cost increases with an increase in the density value, a candidate path 1B including links L with high density values is less likely to be set as the setting path 1A. Accordingly, the densities of the article transport vehicles 3 present in each link L can be easily leveled off, thus making it possible to reduce the possibility that jamming frequently occurs in a specific link L.

Figure 13:
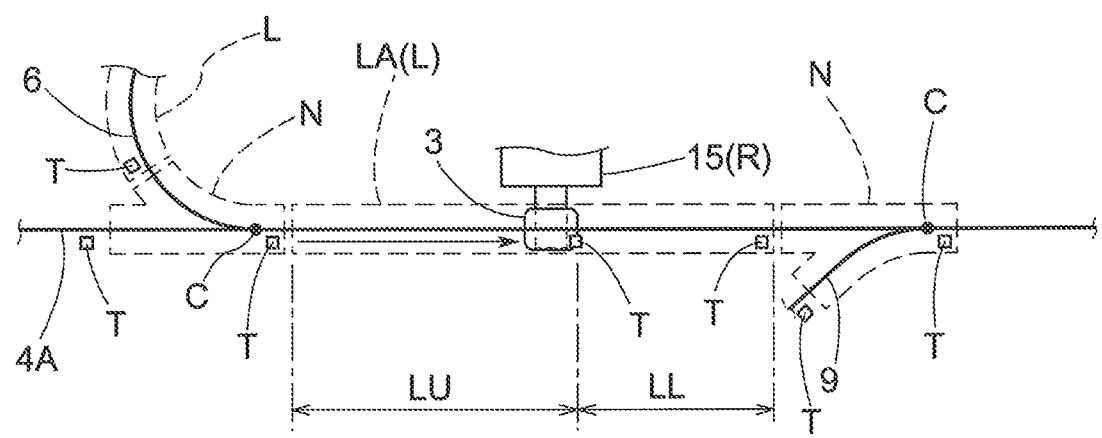
FIG. 13 is a diagram showing an upstream portion and a downstream portion of a target link.

In the present embodiment, the link costs of the link L at the current position and the link L at the destination of the links L belonging to the candidate path 1B are corrected. As shown in FIG. 13, for the link L at the current position, the reference passage time and the actual passage time are corrected based on the proportion of a region LL of the link L that is located downstream relative to the destination. That is, if the reference passage time is 5 seconds, the actual passage time is 20 seconds, and the proportion of the downstream region LL is 40%, then the reference passage time is corrected to 2 seconds, and the actual passage time is corrected to 8 seconds, i.e., the article transport vehicle 3 corrects the vehicle count value, assuming that only the other vehicle 3B that is assumed to be present downstream relative to the current position in the target link LA is present in the target link LA. For the link L at the destination, the reference passage time and the actual passage time are corrected based on the proportion of a region LU of the link L that is located upstream relative to the destination. That is, if the reference passage time is 5 seconds, the actual passage time is 20 seconds, and the proportion of the upstream region LU is 60%, then the reference passage time is corrected to 3 seconds, and the actual passage time is corrected to 12 seconds, i.e., the article transport vehicle 3 corrects the vehicle count value, assuming that only the other vehicle 3B that is assumed to be present upstream relative to the current position in the target link LA is present in the target link LA. In this manner, for the link L at the current position and the link L at the destination, the link cost is corrected by correcting the corrected reference passage time, actual passage time, and vehicle count value.

Based on the link cost that has been determined in the above-described manner, the control device H determines the respective path costs of a plurality of candidate paths 1B. The path cost is a cost representing an estimated value of the time required for the setting vehicle 3C to travel on the candidate path 1B. In the present embodiment, the control device H determines the path cost of each candidate path 1B by adding up the respective link costs for all the links L belonging to the candidate path 1B, and the respective node costs for the nodes N belonging to the candidate path 1B. Then, the control device H compares the path costs respectively determined for the plurality of candidate paths 1B, and sets the candidate path 1B with the lowest path cost from among the plurality of candidate paths 1B as the setting path 1A. This makes it possible to increase the possibility that a path that requires the shortest time to reach the destination can be set as the setting path 1A in the actual traveling situation, appropriately taking into consideration the influence of the other vehicles 3B present on the travelable path 1.

2. Other Embodiments

Next, other embodiments of the article transport facility will be described.

(1) The above embodiment has described, as an example, a configuration in which the reference cost is set based on the passage time when the target vehicle 3A actually travels on the target link LA in a state in which the other vehicle 3B is not present in the target link LA. However, the present disclosure is not limited to such a configuration. For example, it is possible to adopt a configuration in which the reference cost is set based on the path length and the shape of the target link LA, without actually causing the target vehicle 3A to travel. Specifically, the ideal traveling speed of the article transport vehicle 3 at each position is obtained based on the shape of the target link LA, then the reference passage time of the target link LA by the article transport vehicle 3 is obtained based on the traveling speed and the path length of the target link LA at that position, and the reference cost can be set based on that reference passage time.

(2) The above embodiment has described, as an example, a configuration in which the control device H sets the reference cost for each of all the links L belonging to the travelable path 1 before performing the path setting control for the first time. However, the present disclosure is not limited to such a configuration. For example, it is also preferable to adopt a configuration in which, if the article transport vehicle 3 travels on the target link LA in a state in which the other vehicle 3B is not present, the passage time of the target link LA by the traveling is acquired as the reference passage time also after the start of transport of the article W in the article transport facility (after the start of the operation), and the reference cost is updated as needed.

(3) The above embodiment has described, as an example, a configuration in which the increased amount of the actual passage time for one other vehicle 3B is used as the vehicle count-related increased time, the increased amount being obtained by dividing the increased amount of the actual passage time relative to the reference passage time when the other vehicle 3B is present in the target link LA by the vehicle count indicated in the vehicle count information.

However, the present disclosure is not limited to such a configuration. For example, it is possible to adopt a configuration in which the vehicle count-related increased time is obtained in the same manner also when the other vehicle 3B is not present in the target link LA: The vehicle count-related increased time is obtained by dividing the increased amount by the vehicle count indicated in the vehicle count information if the vehicle count indicated in the vehicle count information is greater than or equal to 1, and the vehicle count-related increased time is obtained assuming that the vehicle count indicated in the vehicle count information is 1 if the vehicle count indicated in the vehicle count information is 0 in order to prevent the denominator from being 0. Alternatively, it is possible to adopt a configuration in which a vehicle count obtained by adding 1 to the vehicle count indicated in the vehicle count information is always used, and the vehicle count-related increased time is obtained by dividing the increased amount by that vehicle count.

(4) The above embodiment has described, as an example, a configuration in which the increased amount of the actual passage time relative to the reference passage time for one other vehicle 3B is used as the vehicle count-related increased time. However, the present disclosure is not limited to such a configuration. For example, it is also preferable to adopt a configuration in which the vehicle count-related increased time is represented as a correlation map or a correlation formula between the increased amount of the actual passage time relative to the reference passage time and the vehicle count information. As a specific example, the horizontal axis may represent the vehicle count for other vehicles 3B, the vertical axis may represent the increased amount of the actual passage time relative to the reference passage time, and a correlation map in which their correlation relationship is represented as a linear or non-linear graph or a numerical table, or a correlation formula representing such a relationship in a mathematical formula may also be used as the vehicle count-related increased time. In the case of adopting these configurations, for example, it is possible to set the vehicle count-related increased time so as to represent a non-linear correlation such that the rate of increase of the actual passage time gradually increases with an increase in the vehicle count: The vehicle count-related increased time is set as 3 seconds if the vehicle count indicated in the vehicle count information is 1, 8 seconds if the vehicle count is 2, 15 seconds if the vehicle count is 3, and so forth.

(5) The above embodiment has illustrated a configuration in which the vehicle count value is determined assuming that, in addition to the other vehicle 3B that has been determined to be actually present in the target link LA, the other vehicle 3B for which the setting path 1A passing through the target link LA has already been set is also present in the target link LA. However, the present disclosure is not limited to such a configuration. For example, it is possible to adopt a configuration in which the vehicle count value is determined based only on the other vehicle 3B that has been determined to be actually present in the target link LA when performing the path setting control.

(6) The above embodiment has described, as an example, a configuration in which the link cost is corrected using the density value. However, the present disclosure is not limited to such a configuration. For example, it is possible to adopt a configuration in which the correction of the link cost using the density value is not performed. For example, it is also possible to adopt a configuration in which the link cost is corrected using a value representing the path length of the target link LA. In this case, for example, it is possible to adopt a configuration in which the link cost is corrected such that the link cost decreases with an increase in the path length of the target link LA. Alternatively, it is possible to adopt a configuration in which the link cost is corrected using an indicator value other than these values.

(7) The above embodiment has described, as an example, a configuration in which, in the case of determining the path cost of a candidate path 1B, the node costs of the nodes N belonging to the candidate path 1B is added to the link costs of the links L belonging to the candidate path 1B. However, the present disclosure is not limited to such a configuration. For example, it is possible to adopt a configuration in which the node cost is not taken into consideration in the case of determining the path cost of the candidate path 1B. In this case, it is also preferable to adopt a configuration in which a node N is constituted only by a connection point C having no path length, and the entire path portion connecting a pair of adjacent connection points C constitutes a link L.

(8) The above embodiment has described, as an example, a configuration in which the control device H determines the path cost of the candidate path 1B using the link costs of all the links L belonging to the candidate path 1B. However, the present disclosure is not limited to such a configuration. For example, it is possible to adopt a configuration in which the path cost is obtained based on some of the links L belonging to the candidate path 1B, such as a configuration in which the link cost of the link L in which the current position of the setting vehicle 3C is located, and the link cost of the link L in which the destination is located are not included in the path cost.

(9) The above embodiment has described, as an example, a configuration in which the link cost is determined for each of all the links L belonging to the candidate path 1B. However, the present disclosure is not limited to such a configuration. For example, it is possible to adopt a configuration in which the control device H determines the link cost of each of the links L belonging to the candidate path 1B in order to determine the path cost, while accumulating the link costs along the candidate path 1B. In that case, it is possible to adopt a configuration in which, if the accumulated value becomes greater than or equal to a specified threshold in the course of accumulating the link costs, it is determined that the candidate path 1B is no longer a candidate for the setting path 1A, and the subsequent calculation of the link cost is stopped. Additionally, it is preferable that the specified threshold is set according to the distance from the current position to the destination.

(10) The above embodiment has described, as an example, a configuration in which, when there are a plurality of candidate paths 1B, the path cost is obtained for all of the candidate paths 1B. However, the present disclosure is not limited to such a configuration. For example, among a plurality of candidate paths 1B, a candidate path 1B with an overall path length extending over a distance greater than or equal to a specified multiple of the shortest candidate path 1B may be considered as not being a candidate for the setting path 1A, and the path cost may not be obtained for that candidate path 1B.

(11) The above embodiment has described, as an example, a configuration in which the position information S of the article transport vehicle 3 is the position information S read from the detection target object T. However, the present disclosure is not limited to such a configuration.

It is possible to adopt a configuration in which the position information S of the article transport vehicle 3 includes, in addition to the information on the position read from the detection target object T, information on the traveling distance of the article transport vehicle 3 from that position. With this configuration, the control device H can acquire a specific position of the article transport vehicle 3. When the article transport vehicle 3 includes, for example, another position detection device such as a global positioning system (GPS), it is possible to adopt a configuration in which the position information S acquired by the position detection device is transmitted to the control device H.

(12) The above embodiment has described, as an example, a configuration in which the article transport vehicle 3 travels on the travel rail 2 suspended and supported from the ceiling. However, the present disclosure is not limited to such a configuration. For example, it is possible to adopt a configuration in which the article transport vehicle 3 travels on a travel rail 2 installed in a state other than being suspended and supported from the ceiling, for example, on a travel rail 2 installed on the floor surface. It is also possible to adopt a configuration in which the article transport vehicle 3 travels without any rail, for example, directly travels on the floor surface, instead of traveling on the travel rail 2.

(13) Note that the configurations disclosed in the embodiments described above are applicable in combination with configurations disclosed in other embodiments as long as no inconsistency arises. With regard to the other configurations as well, the embodiments disclosed herein are illustrative in all respects. Therefore, various modifications and alterations may be made as appropriate without departing from the gist of the present disclosure.

3. Outline of the Embodiment

In the following, an outline of the article transport facility described above will be described.

The article transport facility includes: article transport vehicles that travel along a specified travelable path to transport an article; and a control device that controls the article transport vehicles, wherein the travelable path includes a plurality of nodes at each of which a path is branched or merged, and a plurality of links each of which serves as a path portion connecting a pair of the nodes, the control device performs a path setting control to set, based on a link cost that is set for each of the links, a setting path serving as a path for causing the article transport vehicles to travel from a current position to a destination on the travelable path, the link cost includes a reference cost and a variable cost, one of the article transport vehicles that passes through the links in order to set the link cost is used as a target vehicle, the link through which the target vehicle passes is used as a target link, at least one of the article transport vehicles other than the target vehicle is used as another vehicle, and one of the article transport vehicles for which the setting path is set by the path setting control is used as a setting vehicle, the reference cost is a value that is set based on a reference passage time that is required for the target vehicle to pass through the target link in a state in which the other vehicle is not present in the target link, the variable cost is a value that is set based on a vehicle count-related increased time by which an actual passage time is increased relative to the reference passage time according to the number of the other vehicles present in the target link, the actual passage time being a time required for the target vehicle to pass through the target link in an actual traveling state in which the target vehicle travels on the target link in a state in which the other vehicle is present in the target link, and, in the path setting control, the control device determines a vehicle count value that is the number of the other vehicles that are assumed to be present in the target link, determines, based on the variable cost according to the vehicle count value and the reference cost, the link cost of each of the links on candidate paths serving as candidates for the setting path from the current position of the setting vehicle to the destination, obtains, based on the link costs, path costs that are costs of the candidate paths, and sets the setting path based on the path cost of each of the candidate paths.

With this configuration, when the control device sets the setting path by the path setting control, the control device determines the link cost of each of the links on the candidate paths serving as candidates for the setting path from the current position of the setting vehicle to the destination. The link cost includes a reference cost and a variable cost. Here, the variable cost is a value that is set based on a vehicle count-related increased time that increases according to the number of the other vehicles. In the path setting control, a variable cost according to the vehicle count value of the other vehicles that are assumed to be present in each of the links on the candidate paths is used. Then, a path cost that is the cost of each of the candidate paths is obtained based on the link costs determined in this manner, and the setting path is set based on the path cost of each of the candidate paths. Accordingly, with this configuration, it is possible to appropriately set the setting path, taking into consideration the path traveling time under no influence of the other vehicles and the path traveling time according to the number of other vehicles under the influence of the other vehicles. Therefore, it is possible to increase the possibility that a path that requires a shorter time to reach the destination can be set as the setting path.

Here, it is preferable that the control device causes the target vehicle to travel a plurality of times on the target link in a state in which the other vehicle is present in the target link, acquires, at each of the times of traveling, vehicle count information indicating the number of the other vehicles present in the target link and the actual passage time, and obtains the vehicle count-related increased time based on a correlation between an increased amount of the actual passage time relative to the reference passage time and the vehicle count information.

The actual time required for the target vehicle to pass through the target link varies depending on the traveling speed and the acceleration/deceleration of the target vehicle on the target link, the traveling speed and the acceleration/deceleration of each of the other vehicles on the target link, the number of other vehicles, the inter-vehicle distance, and so forth. With this configuration, the target vehicle is caused to travel a plurality of times on the target link in a state in which the other vehicle is present in the target link, and the vehicle count information and the actual passage time at each of the times of traveling are acquired, and thus it is possible to acquire information indicating the relationships between the vehicle count information and the actual passage time in various situations. Also, by obtaining the vehicle count-related increased time based on the correlation between the increased amount of the actual passage time relative to the reference passage time and the vehicle count information, obtained from such information, it is possible to obtain a vehicle count-related increased time that takes various situations into consideration.

It is preferable that the control device uses, as the vehicle count-related increased time, an increased amount of the actual passage time for one other vehicle, the increased amount being obtained by dividing the increased amount of the actual passage time relative to the reference passage time by the vehicle count indicated in the vehicle count information.

With this configuration, the vehicle count-related increased time is a value indicating the increased amount of the actual passage time for one other vehicle, and it is thus possible to obtain the variable cost based on a value obtained by multiplying the vehicle count-related increased time and the vehicle count value. Therefore, it is possible to easily calculate the variable cost.

It is preferable that each of the plurality of article transport vehicles transmits position information indicating its own position to the control device, and the control device stores the position information received from each of the plurality of article transport vehicles in association with time in a storage unit, and acquires the vehicle count information and the actual passage time based on a position of each of the article transport vehicles at each of the times, the position being obtained from the information stored in the storage unit.

An article transport vehicle often includes the function of transmitting position information to a control device, and the control device often includes the function of managing time and a storage unit that stores information. With this configuration, by using the function of the article transport vehicle to transmit position information to a control device, and the function of the control device to manage time and the storage unit, it is possible to acquire the vehicle count information and the actual passage time without providing the article transport vehicle or the control device with any new function.

It is preferable that the control device determines the vehicle count value, assuming that the other vehicle for which the setting path passing through the target link has already been set is present in the target link, regardless of a current position of the other vehicle.

Other vehicles that are not present in the target link forming the candidate path at the time of performing the path setting control for the setting vehicle can be present in the target link at the time when the setting vehicle travels on the target link if the setting path passing through the target link has been set for the other vehicles. With this configuration, the vehicle count value is determined assuming that such other vehicles are present in the target link, regardless of the positions of the other vehicles at the time of performing the path setting control. Accordingly, it is possible to determine the link cost of the target link, taking into consideration not only the degree of congestion of the target link at the time of performing the path setting control for the setting vehicle, but also the degree of congestion of the target link in the future. Therefore, with this configuration, an appropriate setting path can be easily set, taking the future degree of congestion of each link.

It is preferable that the control device uses, as a density value, a value obtained by dividing the vehicle count value by a maximum value of the number of the article transport vehicles that can be present in the target link, and corrects the link cost such that the link cost increases with an increase in the density value in the path setting control.

With this configuration, the degree of congestion of the target link according to the maximum value of the number of article transport vehicles that can be present in the target link can be reflected in the link cost. In addition, it is possible to correct the link cost such that the link cost increases with an increase in the density value, and therefore a candidate path including a link with a high density value is less likely to be set as the setting path. Accordingly, the densities of the article transport vehicles present in each link can be easily leveled off, thus making it possible to reduce the possibility that jamming frequently occurs in a specific link.

INDUSTRIAL APPLICABILITY

The techniques according to the present disclosure are applicable to an article transport facility including article transport vehicles that travel along a specified travelable path to transport an article, and a control device that controls the article transport vehicles.

What is claimed is:

1. An article transport facility comprising:
    article transport vehicles that travel along a specified travelable path to transport an article; and
    a control device that controls the article transport vehicles,
    wherein:
    the travelable path includes a plurality of nodes at each of which a path is branched or merged, and a plurality of links each of which serves as a path portion connecting a pair of the nodes,
    the control device performs a path setting control to set, based on a link cost that is set for each of the links, a setting path serving as a path for causing the article transport vehicles to travel from a current position to a destination on the travelable path,
    the link cost includes a reference cost and a variable cost,
    one of the article transport vehicles that passes through the links in order to set the link cost is used as a target vehicle, the link through which the target vehicle passes is used as a target link, at least one of the article transport vehicles other than the target vehicle is used as another vehicle, and one of the article transport vehicles for which the setting path is set by the path setting control is used as a setting vehicle, the reference cost is a value that is set based on a reference passage time that is required for the target vehicle to pass through the target link in a state in which the other vehicle is not present in the target link, the variable cost is a value that is set based on a vehicle count-related increased time by which an actual passage time is increased relative to the reference passage time according to the number of the other vehicles present in the target link, the actual passage time being a time required for the target vehicle to pass through the target link in an actual traveling state in which the target vehicle travels on the target link in a state in which the other vehicle is present in the target link, and, in the path setting control, the control device determines a vehicle count value that is the number of the other vehicles that are assumed to be present in the target link, determines, based on the variable cost according to the vehicle count value and the reference cost, the link cost of each of the links on candidate paths serving as candidates for the setting path from the current position of the setting vehicle to the destination, obtains, based on the link costs, path costs that are costs of the candidate paths, and sets the setting path based on the path cost of each of the candidate paths.

2. The article transport facility according to claim 1, wherein the control device causes the target vehicle to travel a plurality of times on the target link in a state in which the other vehicle is present in the target link, acquires, at each of the times of traveling, vehicle count information indicating the number of the other vehicles present in the target link and the actual passage time, and obtains the vehicle count-related increased time based on a correlation between an increased amount of the actual passage time relative to the reference passage time and the vehicle count information.

3. The article transport facility according to claim 2, wherein the control device uses, as the vehicle count-related increased time, an increased amount of the actual passage time for one other vehicle, the increased amount being obtained by dividing the increased amount of the actual passage time relative to the reference passage time by the vehicle count indicated in the vehicle count information.

4. The article transport facility according to claim 2, wherein each of the plurality of article transport vehicles transmits position information indicating its own position to the control device, and wherein the control device stores the position information received from each of the plurality of article transport vehicles in association with time in a storage unit, and acquires the vehicle count information and the actual passage time based on a position of each of the article transport vehicles at each of the times, the position being obtained from the information stored in the storage unit.

5. The article transport facility according to claim 1, wherein the control device determines the vehicle count value, assuming that the other vehicle for which the setting path passing through the target link has already been set is present in the target link, regardless of a current position of the other vehicle.

6. The article transport facility according to claim 1, wherein the control device uses, as a density value, a value obtained by dividing the vehicle count value by a maximum value of the number of the article transport vehicles that can be present in the target link, and corrects the link cost such that the link cost increases with an increase in the density value in the path setting control.

* * * * *